US006487505B1

(12) United States Patent
Mock et al.

(10) Patent No.: US 6,487,505 B1
(45) Date of Patent: Nov. 26, 2002

(54) METHOD FOR EVALUATING CHARACTERISTIC VALUES OF PIEZO-MECHANICAL SYSTEMS

(75) Inventors: Randolf Mock, München (DE); Eric Chemisky, Haar (DE); Andreas Kappel, Brunnthal (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/581,802

(22) PCT Filed: Feb. 3, 1999

(86) PCT No.: PCT/DE99/00284

§ 371 (c)(1), (2), (4) Date: Jun. 16, 2000

(87) PCT Pub. No.: WO99/40408

PCT Pub. Date: Aug. 12, 1999

(30) Foreign Application Priority Data

Feb. 3, 1998 (DE) .......................................... 198 04 196

(51) Int. Cl.[7] ............................ H05K 7/00; H01R 4/60; G06F 19/00

(52) U.S. Cl. .......................................... 702/33; 364/558

(58) Field of Search ............................ 702/33; 364/558, 364/431.09; 324/727; 235/380; 360/2; 329/302; 51/165

(56) References Cited

U.S. PATENT DOCUMENTS

| | | | | |
|---|---|---|---|---|
| 4,539,643 A | * | 9/1985 | Suzuki et al. | 364/431.09 |
| 5,136,817 A | * | 8/1992 | Tabata et al. | 51/165.71 |
| 5,229,943 A | | 7/1993 | Eigler et al. | |
| 5,354,975 A | * | 10/1994 | Ishibashi et al. | 235/380 |
| 5,396,370 A | * | 3/1995 | Behr et al. | 360/2 |
| 5,499,541 A | | 3/1996 | Hopf et al. | |
| 5,617,338 A | * | 4/1997 | Sugano et al. | 364/558 |
| 5,625,343 A | | 4/1997 | Rottmar | |
| 5,764,068 A | * | 6/1998 | Katz et al. | 324/727 |
| 5,862,604 A | | 1/1999 | Fuchs et al. | |
| 5,867,059 A | * | 2/1999 | Huang et al. | 329/302 |

FOREIGN PATENT DOCUMENTS

| | | |
|---|---|---|
| DE | 43 24 692 | 1/1995 |
| EP | 0 753 717 | 4/1996 |
| EP | 0 849 574 | 11/1997 |
| WO | WO 90/11207 | 4/1990 |
| WO | WO 94/08214 | 4/1994 |
| WO | WO 94/21983 | 9/1994 |

* cited by examiner

*Primary Examiner*—John S. Hilten
*Assistant Examiner*—Tung S Lau
(74) *Attorney, Agent, or Firm*—BakerBotts LLP

(57) ABSTRACT

For diagnosing coupled piezo-mechanical systems, methods are used which utilize electrical characteristic curves of the piezo-element that is contained in the piezo-mechanical systems. These electrical characteristic curves contain information about the mechanical condition of the overall piezo-mechanical system, which can be interpreted by suitable evaluating methods. It is thus possible to perform a diagnosis in which malfunctions and failures of the piezo-mechanical system can be detected (e.g. wear or failure of particular components). An important field of application is the diagnosis of fuel injectors which are controlled via piezo-actuators.

15 Claims, 2 Drawing Sheets

1 8 9 10 Δt 2 3

METHOD FOR EVALUATING CHARACTERISTIC VALUES OF PIEZO-MECHANICAL SYSTEMS

BACKGROUND OF THE INVENTION

The invention relates to a method for evaluating electrical characteristic values of a coupled piezo-mechanical system.

Piezo-elements are being employed with increasing frequency to control mechanical movements, for instance in fuel injectors.

The coupled system formed of a piezo-element, for instance a piezo-ceramic, and a mechanically movable mechanism that is connected to it, is referred to here as a piezo-mechanical system. The piezo-mechanical system can additionally be influenced by another mode of action, for instance by means of a hydraulic system or by an electromagnetically driven motor.

As opposed to an electromagnetic drive as is primarily in use today, the force transmission from the piezo-element to the mechanical moving parts is not performed indirectly via a force field (e.g. a magnetic field), but rather directly via a mechanical coupling (hydraulic system, tappet, etc.).

Another difference is that the piezo-element, as a mechanical-electrical converter, is both part of the mechanical action loop, or subsystem, and part of the electrical action loop, or subsystem. The coupling effect between mechanical and electrical subsystems is approximately linear in a piezo-element (that is, it follows relationships which are relatively easy to describe), unlike in an electromagnetically driven actuator, for example. This means that a modification of a technical parameter (e.g. due to wear or aging) changes the mechanical stiffness of components, thereby exerting a direct influence on the counterforce experienced by the piezo-element.

It is known that the impedance characteristic of the piezo-element as a whole, and the position of impedance maxima and minima in particular, changes when a mechanical influence quantity (such as the pressure on the piezo-element) is modified.

SUMMARY OF THE INVENTION

It is the object of the present invention to use the characteristics of a piezo-element to diagnose a piezo-mechanical system.

According to the method of the present invention for diagnosing a piezo-mechanical system which contains at least one piezo-element and a mechanical system controlled by the piezo-element, an electrical piezo-signal which is tapped at the piezo-element is compared to an electrical signal that controls the piezo-element. The condition of the piezo-mechanical system is determined from a deviation of these two signals from one another.

The object is achieved by exploiting the fact that the state of the mechanical subsystem influences the electrical characteristic values of the piezo-element (henceforth, the piezo-signal) in a characteristic fashion on the basis of the mechanical-electrical coupling the via the piezo-element. By measuring and evaluating electrical characteristic values of the piezo-element, it is possible to diagnose the mechanical function of the piezo-mechanical system; that is, to detect malfunctions and failures.

Besides the states of the mechanical subsystem, the state of the electrical subsystem (incl. piezo-element) can be diagnosed by the electrical characteristic values. Thus, for example, short circuits or leaks in the piezo-element lead to altered switching times of the system, owing to the altered impedance of the piezo-element, which times manifest themselves in various ways during the making and breaking phases in the time-dependent behavior of electrical characteristic values.

One diagnosis option is highly advantageous in the automotive field, for example, in which the legal regulation "OBD2" stipulates that all parts of an auto that are relevant to its safety and environmental impact must be monitored during the operation of a vehicle with respect to their proper functioning. This applies particularly to fuel injectors, the connection of which directly affects both the emission of pollutants and the reliable operation of a motor.

Another example is aeronautical construction, in which the mechanical movement of actuators, particularly of the elevators and vertical rudders, is determined by electrical signals ("fly by wire"). There are airplane constructions in existence which are not fit to fly without a permanent control and monitoring of the mechanical control parts. Malfunctions or damage at a mechanical drive, for instance at a linear drive with a piezoactuator, must therefore be detected early.

DESCRIPTION OF THE PREFERRED EMBODIMENTS

Figure 1:
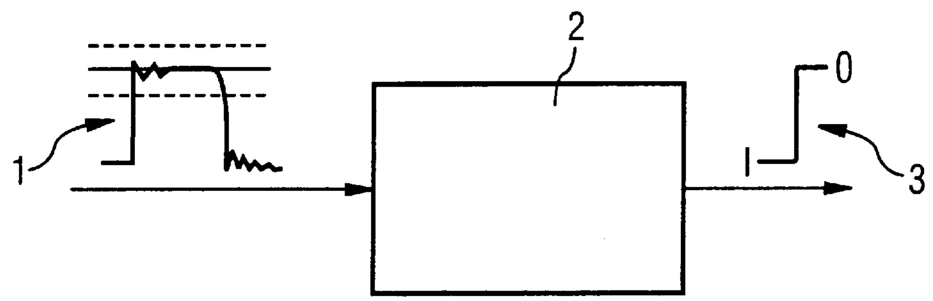
FIG. 1 is a schematic of an option for diagnosing a piezo-mechanical system using threshold value interrogation of the piezo-signal.

FIG. 1 schematically represents a method for diagnosing a piezo-mechanical system by interrogating a threshold value of a piezo-signal 1, which can be a voltage signal or a current signal, for example. The sequence of the process is represented as a flowchart running from left to right.

It is assumed that, to achieve excursion of the piezo-element, a square-wave signal is applied to it, for instance to switch a fuel injector on and off. By the coupling with the mechanical subsystem that is secured at the piezo-element, an electrical supplementary signal is superimposed onto the externally originating square-wave signal. Altogether, a piezo-signal 1 is measured at the piezo-element. The piezo-signal 1 contains the response of the overall coupled piezo-mechanical system to the applied square-wave signal.

A threshold value interrogation 2 is then performed at the piezo-signal 1; that is, it is checked whether the value of the piezo-signal 1

- crosses a definable threshold value, or
- falls short of a definable threshold, or
- lies in a range that is defined by two different threshold values (the "bandwidth").

The threshold value interrogation 2 thus also encompasses checking whether, given the presence of several threshold values, the value of the piezo-signal 1 lies within a definable set of threshold values. The threshold value interrogation 2 further encompasses interrogating the presence of a signal (e.g. by the threshold value 0).

The process of setting a threshold value includes an assessment of the state of the piezo-mechanical system. On the basis of the threshold value interrogation 2, an output signal 3 is output, which indicates the state of the piezo-mechanical system.

In this Figure the output signal 3 is modified when the value of the piezo-signal 1 exits a bandwidth (here bounded by broken lines) about the maximum of the undisturbed square-wave signal (solid line). When the piezo-signal 1 lies within the predetermined bandwidth, a particular status of the output signal 3 is present, for instance "I" or "off". On the other hand, when the piezo-signal exits the predetermined bandwidth, the status of the output signal 3 is modified (e.g. to "O" or "off").

It is advantageous if the bandwidth is set such that it is not exited given the proper functioning of the piezo-mechanical system ("desired range"). A departure from the desired range then indicates a malfunction.

By this type of method, the state of the entire coupled piezo-mechanical system is diagnosed in a simple manner.

It is advantageous when several threshold values are used for the diagnosis, since this makes it possible to indicate the degree of malfunction as a function of the deviation of the piezo-signal 1 from the desired range by using several signal statuses of the output signal 3 (e.g., a diagnosis "minor malfunction" given a slight deviation from the desired range, and a diagnosis of "major malfunction" given a threshold value that is farther removed from the desired range). This makes possible a differentiated evaluation of a malfunction.

Figure 2:
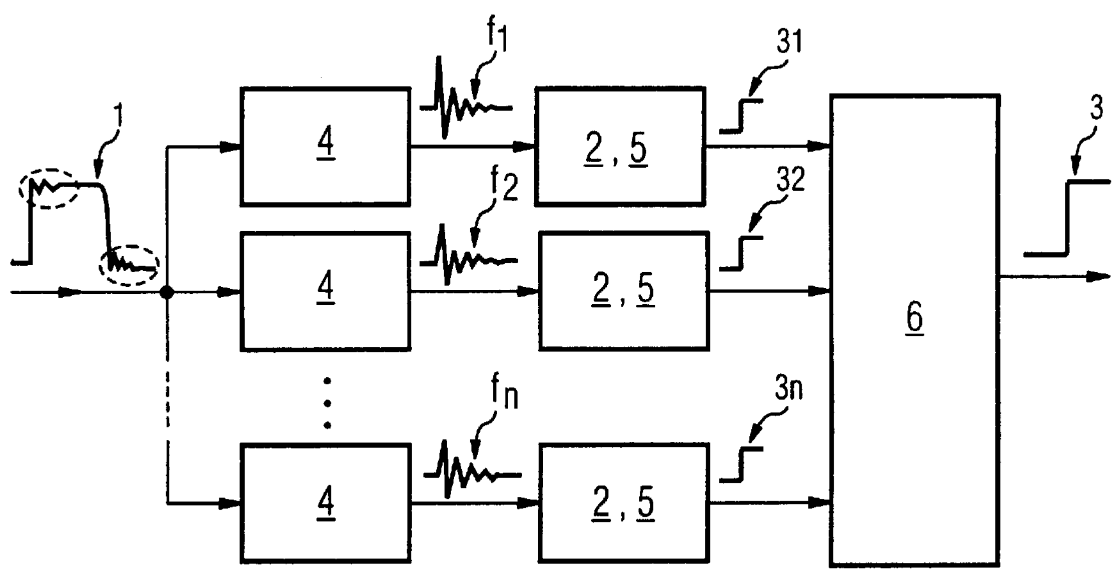
FIG. 2 shows a schematic of a further option for diagnosing a piezo-technical system using threshold value interrogation or extreme value interrogation.

FIG. 2 schematically depicts a further method for diagnosing a piezo-mechanical system by threshold value interrogation 2 of a piezo-mechanical signal 1. The sequence of the process is represented as a flowchart running from left to right.

From the piezo-signal 1, $n(n \geqq 1)$ signals f1 . . . fn, having been frequency-filtered by frequency filtering process 4, are respectively evaluated by a threshold value interrogation 2, which alters the status of a signal 31 . . . 3*n*, respectively. The frequency filtering process 4 is advantageously realized in the form of a bandpass filter or needle filter.

Compared to the threshold value interrogation 2 of the piezo-signal 1 (as in FIG. 1), the advantage of using a frequency filtering 4 is that the separate subsignals f1 . . . fn are characteristic of the behavior of individual mechanical components of a complex piezo-mechanical system. Thus, for example, the deviation of a frequency-filtered signal f1 . . . fn from the respective bandwidth indicates the malfunction of a specific mechanical component.

One or more of the signals 31 . . . 3*n* that are obtained with the aid of the threshold value interrogation 2 are then re-evaluated with the aid of a separate evaluating unit 6. The evaluating unit 6 can prescribe the output signal 3 when a particular combination of signals 31 . . . 3*n* is present, for instance when threshold values of the $1^{st}$ (f1), $2^{nd}$ (f2), $5^{th}$ (f5) and nth (fn) frequency-divided signal are exceeded simultaneously. This is advantageous when several of the frequency-divided signals f1 . . . fn point to the same malfunction.

The evaluation unit 6 is advantageously realized by a digital signal processor (DSP), but also by a suitable analog sequential circuit or a sequential circuit composed of digital standard elements.

It is also possible to evaluate the original piezo-signal 1 in addition to the frequency-filtered signals f1 . . . fn.

The threshold value interrogation can also be replaced, for at least one of the signals f1 . . . fn that are to be evaluated, by an extreme value interrogation 5; that is, by a determination of the local minima and maxima. Since the frequency-filtered signals f1 . . . fn are generally present in the form of a sinusoidal oscillation, the frequency and attenuation of these signals can be determined by an extreme value interrogation 5. Here, too, a desired value range is defined for the values of frequency and attenuation, the exiting of which due to a change of state of a signal 31 . . . 3*n* is indicated. If the piezo-signal 1 is present in the form of a regular oscillation, the signal can also be subjected to an extreme value interrogation 5.

Figure 3:
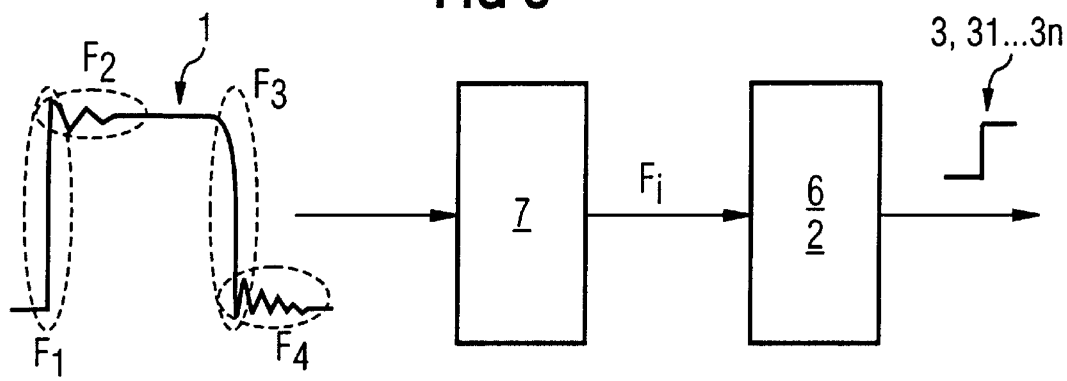
FIG. 3 shows a schematic of an option for diagnosing a piezo-mechanical system using Fourier analysis.

FIG. 3 is a schematic of the evaluation of a piezo-signal 1 by Fourier analysis 7. The sequence of the process is represented as a flowchart running from left to right. The piezo-signal 1 is first processed by a Fourier analysis 7. The Fourier analysis 7 is advantageously realized by a fast Fourier transformation (FFT). The Fourier analysis 7 gives frequencies, frequency shifts, amplitudes and/or half-width values that are contained in the piezo-signal 1. This set of parameters that is output by the Fourier analysis 7 is referenced Fi, with the individual parameters F1 . . . Fn $(N \geqq 1)$. The processing by Fourier analysis 7 does not require frequency filtering 4, but it contains a mechanism for determining the parameter set Fi from the Fourier spectrum.

For the sake of clarity, four regions at the piezo-signal 1 are schematically indicated by broken lines, in which regions the Fourier analysis 7 may detect characteristic frequencies F1 . . . F4. The values of the parameter set Fi can be further evaluated by an evaluating unit 6 (possible by a simple evaluation algorithm per DSP) in a subsequent step, whereby an output signal 3, potentially with several signal statuses, is set by the evaluation unit 6.

The values of one or more parameters F1 . . . Fn of the parameter set Fi can also be evaluated by a threshold value interrogation 2, respectively (summarized in this Figure by one evaluation step). The signals 31 . . . 3*n* so obtained can be further evaluated by an evaluating unit 6, potentially together with values of the parameter set Fi that are obtained directly from the Fourier analysis, whereby an output signal 3, potentially with several signal statuses, is set by the evaluating unit 6 (process not illustrated).

Figure 4:
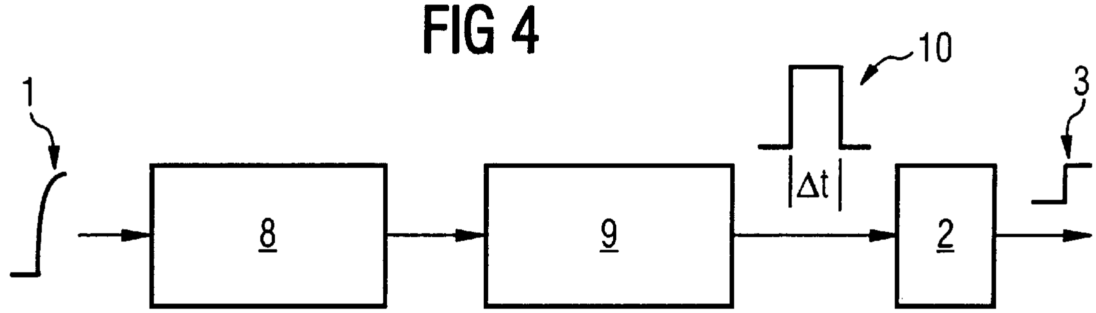
FIG. 4 shows a schematic of an option for diagnosing a piezo-mechanical system using time derivation of the piezo-signal and subsequently applying a Schmitt trigger.

FIG. 4 is a schematic of the evaluation of a piezo-signal 1 by time deviation 8 and subsequent application of a Schmitt trigger 9. This Figure shows only the rising edge of the piezo-signal 1.

Such processing of the piezo-signal 1 is advantageous particularly when the expected amplitude of the supplementary signal is small compared to the externally prescribed signal with which the piezo-element is controlled. What is significant is the formation of the time derivation precisely in the case of the piezo-control utilized here, since in this way the plateaus of the square-wave signal drop out. Beyond this, signal portions of higher frequency are weighted more strongly (if $U(t)=U_0 \cdot \exp(i\omega t)$, then $dU/dt=i\omega U(t)$, and so given a constant amplitude of U(t), its derivation—aside from a phase shift of 90—is linear in frequency. Otherwise, sinusoidal portions of the signal are not changed in their time characteristic, so that the same evaluation method can be applied as was laid out previously in the case of the direct signal evaluation (FIGS. 1–4). This would correspond to a preprocessing of the signals 1, f1 . . . fn that are to be evaluated.

In this exemplifying embodiment, the time-differentiated signal is further processed with the aid of a Schmitt trigger 9, which produces a signal 10 of width Δt. By a process 2 of interrogating the threshold value of this width Δt, the state of an output signal 3 is ascertained.

Figure 5:
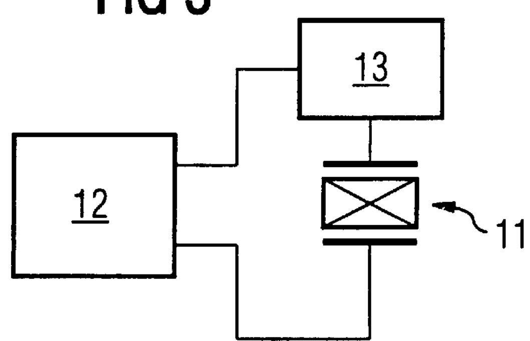
FIG. 5 shows the functioning of an active option for diagnosing a piezo-technical system.

FIG. 5 is a schematic of the functional principle of an active method for diagnosing a piezo-mechanical system, represented as a block circuit diagram.

A piezo-element 11 which is connected to a mechanical device 13, is controlled, for instance by a frequency generator 12, with sinusoidal voltages whose frequency is modified over time. The frequencies used advantageously correspond to the characteristic frequencies of the mechanical subsystem. Since one can affect the characteristic of the electrical impedance of the piezo-element via the mechanical electrical coupling of the piezo-element 11, for instance via a current and/or voltage detector, the technical resonances are seen as peaks in the electrical impedance curve. These impedance peaks can be evaluated either via the absolute value or via the phase.

This type of arrangement can be used for testing a piezo-mechanical system, so that the oscillation characteristics of the piezo-mechanical system can be analyzed, or for determining resonant frequencies, for example.

The diagnostic method represented in FIGS. 1–5 can be employed for monitoring the functioning of fuel injectors that are equipped with piezo-actuators, for example. A piezo-element, for instance a piezo-ceramic, can control a control needle, potentially via a stroke amplifier.

In gasoline direct injections, this control needle can directly control the amount of fuel that is injected into the combustion space of a motor in that the control needle closes the opening between the fuel supply and the combustion space. In diesel direct injections (what are known as common rail injection methods), the control needle can control a hydraulic valve, for example, which in turn guides an injection needle that closes the opening between the fuel supply and the combustion space.

In these cases, the above described method of diagnosis could detect a closing or clamping of the control needle or of the injection needle, or a pressure drop in the pressure loop of the hydraulic valve.

Although various minor changes and modifications might be proposed by those skilled in the art, it will be understood that our wish is to include within the claims of the patent warranted hereon all such changes and modifications as reasonably come within our contribution to the art.

What is claimed is:

1. A method for diagnosing a piezo-mechanical system comprising the steps of: providing at least one piezo-element and a mechanical system controlled by the piezo-element;

comparing an electrical piezo-signal tapped at the piezo-element to an electrical signal that controls the piezo-element; and determining a condition of the piezo-mechanical system from a deviation of these two signals from one another.

2. The method of claim 1 wherein the piezo-signal undergoes a threshold value interrogation on the basis of a result of which at least one output signal is modified.

3. The method of claim 1 wherein $n(n \geqq 1)$ frequency-filtered signals are obtained from the piezo-signal, and in $m(1 \geqq m \geqq n)$ frequency-filtered signals a respective threshold value interrogation is performed, on the basis of a result of which an output signal is respectively modified.

4. The method of claim 3 wherein a status of at least one output signal is determined by means of an evaluating unit, whereby the evaluating unit applies a random combination of signals of the threshold value interrogations to the determination of the output signal.

5. The method of claim 4 wherein the piezo-signal is additionally used to determine the output signal.

6. The method of claim 1 wherein in at least one signal that is to be evaluated, an extreme value interrogation is performed instead of a threshold value interrogation.

7. The method of claim 1 wherein at least one of the signals that are to be evaluated is derived as a function of time.

8. The method of claim 1 wherein the piezo-signal undergoes a Fourier analysis, and at least one of the values that is output by the Fourier analysis is subjected to a threshold value interrogation, on the basis of which a status of an output signal is modified.

9. The method of claim 8, in which the Fourier analysis is a fast Fourier transformation.

10. The method of claim 1 wherein the piezo-signal is derived as a function of time and is then processed by a Schmitt trigger to modify a status of the output signal on the basis of a signal produced by the Schmitt trigger.

11. The method of claim 1 in which a piezo-signal is evaluated in that a piezo-element is controlled with a voltage signal, at least one of an absolute value and phase of peaks of an electrical impedance of the piezo-element is measured, and a value of the at least one absolute value and phase is then used for diagnosis.

12. The method of claim 11 in which the piezo-element is controlled with voltages of variable frequency which are sinusoidal over time.

13. The method of claim 12 wherein frequencies of the sinusoidal voltages correspond to resonant frequencies of a mechanical subsystem of the piezo-mechanical system.

14. The method of claim 1 wherein the method is utilized in a fuel injector.

15. A method for diagnosing a piezo-mechanical system which contains at least one piezo-element and a mechanical system controlled by the piezo-element, comparing an electrical piezo-signal derived from the piezo-element to an electrical signal that controls the piezo-element; and determining a condition of the piezo-mechanical system from a deviation of these two signals from one another.

* * * * *